(12) United States Patent
Tanaka et al.

(10) Patent No.: US 12,224,157 B2
(45) Date of Patent: Feb. 11, 2025

(54) PLASMA PROCESSING APPARATUS AND PLASMA PROCESSING METHOD

(71) Applicant: HITACHI HIGH-TECH CORPORATION, Tokyo (JP)

(72) Inventors: Yuki Tanaka, Tokyo (JP); Takamasa Ichino, Tokyo (JP); Shintarou Nakatani, Tokyo (JP); Ryusuke Eijima, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/763,320

(22) PCT Filed: Mar. 25, 2021

(86) PCT No.: PCT/JP2021/012484
§ 371 (c)(1),
(2) Date: Mar. 24, 2022

(87) PCT Pub. No.: WO2022/201409
PCT Pub. Date: Sep. 29, 2022

(65) Prior Publication Data
US 2024/0055232 A1 Feb. 15, 2024

(51) Int. Cl.
*H01L 21/67* (2006.01)
*H01J 37/32* (2006.01)

(52) U.S. Cl.
CPC .. *H01J 37/32449* (2013.01); *H01J 37/32183* (2013.01); *H01L 21/67069* (2013.01); *H01L 21/67103* (2013.01); *H01J 2237/334* (2013.01)

(58) Field of Classification Search
None
See application file for complete search history.

(56) References Cited

U.S. PATENT DOCUMENTS 5,558,717 A 9/1996 Zhao et al.
5,755,511 A 5/1998 Peuse et al.
(Continued)

FOREIGN PATENT DOCUMENTS

JP H08227859 A 9/1996
JP 2005516379 A 6/2005
(Continued)

OTHER PUBLICATIONS

Search Report mailed Jun. 29, 2021 in International Application No. PCT/JP2021/012484.
(Continued)

*Primary Examiner* — Allan W. Olsen
(74) *Attorney, Agent, or Firm* — Miles & Stockbridge, P.C.

(57) ABSTRACT

A plasma processing apparatus having an improved yield includes a metal base member having a disk shape or a cylindrical shape arranged inside a sample table; a refrigerant flow path arranged multiple times in a concentrical shape around a center of the base member; at least one temperature sensor; and a controller configured to detect a temperature of the base member or the wafer using the temperature sensor. The controller is configured to detect the temperature of the base member or the wafer based on one of a plurality of linear functions indicating a relation between an error and a set temperature of the refrigerant, and the linear functions are different corresponding to regions of a plurality of continuous temperature ranges within an adjustable temperature range of the refrigerant, and the plurality of linear functions include the same coefficient and have a point where the error is 0.

8 Claims, 5 Drawing Sheets

(56) References Cited

U.S. PATENT DOCUMENTS

| | | | |
|---|---|---|---|
| 2003/0003749 | A1 | 1/2003 | Sexton et al. |
| 2005/0193953 | A1 | 9/2005 | Makino |
| 2008/0170969 | A1 | 7/2008 | Yoshioka et al. |
| 2015/0214014 | A1 | 7/2015 | Sato et al. |
| 2016/0378092 | A1 | 12/2016 | Yamamoto et al. |
| 2018/0211893 | A1 | 7/2018 | Ichino et al. |
| 2019/0177849 | A1 | 6/2019 | Mo et al. |
| 2020/0177825 | A1 | 6/2020 | Kitayama et al. |
| 2023/0168192 | A1* | 6/2023 | Ichimura ............ G01N 21/3504 250/343 |

FOREIGN PATENT DOCUMENTS

| | | |
|---|---|---|
| JP | 2005252201 A | 9/2005 |
| JP | 2015141908 A | 8/2015 |
| JP | 2016018918 A | 2/2016 |
| JP | 2017011169 A | 1/2017 |
| JP | 2018120881 A | 8/2018 |
| JP | 2019104974 A | 6/2019 |
| JP | 2020095020 A | 6/2020 |
| KR | 20150089907 A | 8/2015 |

OTHER PUBLICATIONS

Written Opinion mailed Jun. 29, 2021 in International Application No. PCT/JP2021/012484.
Office Action mailed Aug. 13, 2018 for Korean Application No. 10-2017-0112446.
Office Action mailed Jun. 20, 2019 in U.S. Appl. No. 15/715,717.
Office Action mailed Oct. 24, 2019 in U.S. Appl. No. 15/715,717.
Office Action mailed Sep. 27, 2022 in Taiwanese Application No. 111109231.

* cited by examiner

PLASMA PROCESSING APPARATUS AND PLASMA PROCESSING METHOD

TECHNICAL FIELD

The present invention relates to a plasma processing apparatus and a plasma processing method.

BACKGROUND ART

A known plasma processing apparatus includes a processing chamber arranged inside a vacuum container and a sample table arranged at a lower portion of the processing chamber. A substrate-like sample to be processed such as a semiconductor wafer is placed on an upper surface of the sample table. The plasma processing apparatus processes the sample by using plasma formed in the processing chamber.

An example of such a plasma processing apparatus is disclosed in PTL 1. In the disclosed plasma processing apparatus, the inside of a metal base member having a disk shape or a cylindrical shape and forming a sample table arranged in a processing chamber inside a vacuum container is provided with a refrigerant flow path which is arranged multiple times in a concentrical shape and through which a refrigerant flows inside, and a plurality of temperature sensors for detecting a temperature of the base member. Each of the temperature sensors is inserted up to an upper end portion inside a sensor hole that extends from a bottom surface of the base member to a position between an upper end of the refrigerant flow path and an upper surface of the base member through a space between the multiple refrigerant flow paths. From an output detected by the temperature sensor at the upper end of the hole, the temperature of the sample placed on the upper surface of the base member or an upper surface of a dielectric film such as ceramics covering the upper surface of the base member can be detected.

CITATION LIST

Patent Literature

PTL 1: JP-A-2018-120881

SUMMARY OF INVENTION

Technical Problem

The following problems have occurred in the related art. Specifically, in recent years, in order to achieve high degree of integration of semiconductor devices, processing conditions of semiconductor wafers for manufacturing the devices have become more widespread. For example, types of film layer materials to be processed are also increasing, and in order to achieve a desired temperature during processing, which is suitable for each material, it is required to control a temperature condition within a range wider than that according to the related art for a sample table that holds the wafer inside the vacuum container.

Regarding such a temperature condition, as a temperature for processing an oxide film that is not a target during a process of manufacturing mass-produced semiconductor devices in which an etching speed (rate) is difficult to increase in the related art, it is proposed to maintain a wafer in a region of 0° C. or lower (below zero) and process the wafer. It is also proposed to perform etching processing on a film layer containing an organic material by setting a temperature of the wafer being processed to a value of about 100° C. or higher.

Therefore, it is required to control the temperatures of the wafer and the sample table supporting the wafer with high accuracy within a temperature range from a temperature below zero to a region close to 100° C. or higher. In order to control the temperature of the sample table, the inside of a metal member forming a main portion of the sample table is also provided with a refrigerant flow path where a refrigerant adjusted to have a predetermined temperature is supplied and circulated, and a heater for generating heat when a current is supplied. Further, in order to control a desired temperature of the wafer or the sample table suitable for processing with high accuracy, the temperature of the wafer or the sample table is detected or estimated based on an output of a temperature sensor arranged inside the sample table, and information is fed back to adjust a temperature of the refrigerant and a heat generation amount of the heater.

However, when the temperature of the refrigerant increases or decreases in order to achieve the temperature of the sample table or wafer within a wide range, the amount of heat from the heater, which is absorbed by the refrigerant flowing through the refrigerant flow paths also arranged inside the sample table, increases or decreases significantly. Therefore, in the related art, a difference (detection error) between a temperature value indicated by the output of the temperature sensor and an actual temperature of the sample table may increase as the temperature of the sample table changes.

When the detection error is increased in this manner, a yield of the processing of the wafer for manufacturing the semiconductor device is impaired, and a processing efficiency is lowered.

The invention has been made in view of the problems, and an object of the invention is to provide a plasma processing apparatus and a plasma processing method in which the yield is improved by increasing a temperature detection accuracy.

Solution to Problem

In order to solve the problems, one of exemplary plasma processing apparatuses according to the invention includes: a processing chamber which is arranged inside a vacuum container and in which plasma is formed; a sample table that is arranged in the processing chamber and has an upper surface on which a wafer to be processed is placed; a metal base member that is arranged on the sample table and includes, therein, a refrigerant flow path through which a temperature-adjusted refrigerant flows; at least one temperature sensor that is arranged between the refrigerant flow path and an upper surface of the base member and is configured to detect a temperature; and a controller that is configured to detect a temperature of the base member or the wafer being processed, which is placed on the sample table, by using an output from the temperature sensor, in which the controller is configured to detect the temperature of the base member or the wafer based on one of a plurality of relations indicating linear functions obtained from results of measurements taken in advance of the processing of the wafer between a plurality of errors and a corresponding plurality of set temperatures of the refrigerant each defining a difference between a temperature obtained from the output of the temperature sensor and an actual temperature of the base member or the wafer as an error, and the linear functions are different corresponding to regions of a plurality of continuous temperature ranges within an adjustable temperature range of the refrigerant, and the plurality of linear functions include the same coefficient and have a point where the error is 0.

Further, one of exemplary plasma processing methods according to the invention is a plasma processing method performed by a plasma processing apparatus that includes a processing chamber which is arranged inside a vacuum container and in which plasma is formed, a sample table that is arranged in the processing chamber and has an upper surface on which a wafer to be processed is placed, a metal base member that is arranged on the sample table and includes, therein, a refrigerant flow path through which a temperature-adjusted refrigerant flows, and at least one temperature sensor that is arranged between the refrigerant flow path and an upper surface of the base member and is configured to detect a temperature, and the plasma processing method includes:

detecting a temperature of the base member of the wafer based on one of a plurality of relations indicating linear functions obtained from results of measurements taken in advance of the processing of the wafer between a plurality of errors and a corresponding plurality of set temperatures of the refrigerant each defining a difference between a temperature obtained from the output of the temperature sensor and an actual temperature of the base member or the wafer as an error, in which the linear functions are different corresponding to regions of a plurality of continuous temperature ranges within an adjustable temperature range of the refrigerant, and the plurality of linear functions include the same coefficient and have a point where the error is 0.

Advantageous Effect

The invention can provide a plasma processing apparatus and a plasma processing method in which a yield is improved by increasing a temperature detection accuracy.

Issues, configurations, and effects other than those described above are clarified by the following description of embodiments.

DESCRIPTION OF EMBODIMENTS

Embodiments of the invention are described hereinafter with reference to the drawings.

Figure 1:
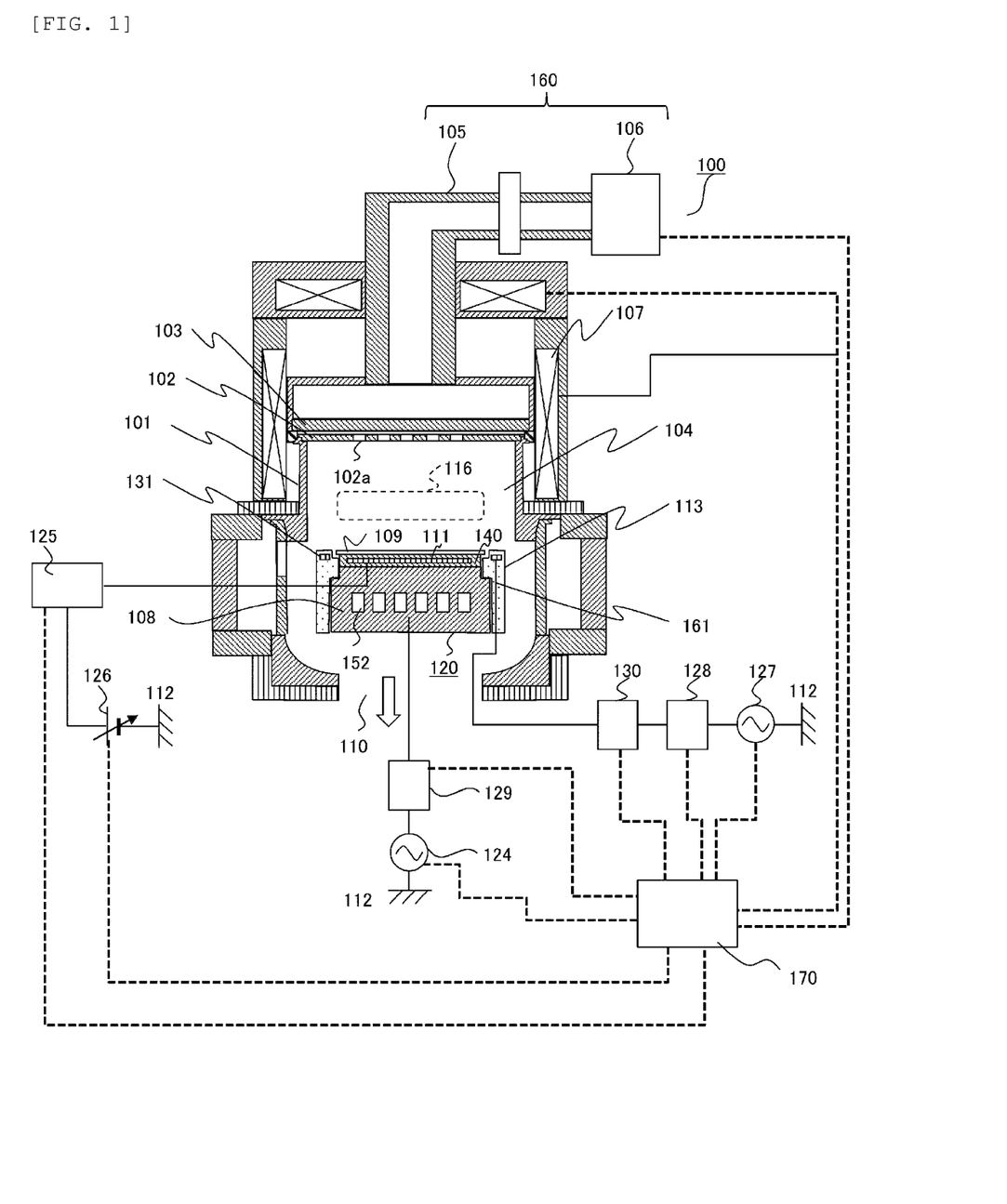
FIG. 1 is a cross-sectional view schematically illustrating an outline of a configuration of a plasma processing apparatus according to an embodiment of the invention.

FIG. 1 is a cross-sectional view schematically illustrating an outline of a configuration of a plasma processing apparatus according to an embodiment of the invention. In particular, FIG. 1 illustrates a plasma etching apparatus that uses a microwave electric field as an electric field for forming plasma, generates electron cyclotron resonance (ECR) between the microwave electric field and a magnetic field to form plasma, and performs etching processing on a substrate-like sample such as a semiconductor wafer by using the plasma.

A plasma processing apparatus 100 illustrated in FIG. 1 is described. The plasma etching apparatus 100 includes a vacuum container 101. The vacuum container 101 includes a processing chamber 104 in which plasma is formed. A dielectric window 103 (for example, made of quartz) in a disk shape is placed as a lid member above an upper end of a cylindrical side wall of an upper portion of the vacuum container 101 to form a portion of the vacuum container 101. A seal member such as an O-ring is sandwiched between a back surface (lower surface) of a peripheral portion of the dielectric window 103 and the upper end of the cylindrical side wall of the vacuum container 101 in a state where the dielectric window is placed above the side wall of the cylindrical vacuum container 101. When the inside of the processing chamber 104 in the vacuum container 101 is exhausted and depressurized, the dielectric window 103 is pressed against the vacuum container 101, so that deformation occurs in the seal member. Accordingly, the inside and outside of the vacuum container 101 or the processing chamber 104 are airtightly partitioned.

A vacuum exhaust port 110 including a circular opening facing the processing chamber 104 is arranged at a lower portion of the vacuum container 101, and communicates with a vacuum exhaust device (not illustrated) that is arranged below the vacuum container 101 and connected to the vacuum container 101. A shower plate 102 forming a circular ceiling surface of the processing chamber 104 and facing the processing chamber 104 is arranged below a lower surface of the dielectric window 103 forming the lid member of the upper portion of the vacuum container 101. The shower plate 102 has a disk shape including a plurality of gas introduction holes 102a penetrating a central portion, and a gas for etching processing is introduced into the processing chamber 104 from above through the gas introduction holes 102a. The shower plate 102 according to the present embodiment is made of a dielectric material such as quartz.

An electric field and magnetic field forming portion 160 that forms the electric field and the magnetic field for generating plasma 116 inside the processing chamber 104 is arranged at a position on an outer upper side of the upper portion of the vacuum container 101. The electric field and magnetic field forming portion 160 includes an electric field generating power source 106 and a waveguide 105. The waveguide 105 is arranged above the dielectric window 103. Through an inside of the waveguide 105, a radio frequency electric field having a predetermined frequency for generating the plasma 116 is transmitted so as to be introduced into the processing chamber 104. A cylindrical portion forming a lower portion of the waveguide 105 is a cylinder having a shaft in a vertical direction and communicating with the inside of the processing chamber 104 above a central portion of the dielectric window 103. The cylindrical portion has a diameter less than that of the dielectric window 103. The other end portion of the waveguide 105 is provided with the electric field generating power source 106 for transmitting and forming the radio frequency electric field to be transmitted through the inside of the waveguide 105 is arranged. The predetermined frequency of the electric field is not particularly limited, and a microwave of 2.45 GHz is used in the present embodiment.

A magnetic field generating coil 107 is arranged in a manner of surrounding a lower end portion of the cylindrical portion of the waveguide 105 above the dielectric window 103 of the processing chamber 104 and an outer peripheral of the side wall of the vacuum container 101 forming a cylindrical portion of the processing chamber 104. The magnetic field generating coil 107 includes electromagnets and yokes arranged in a plurality of stages in the vertical direction to which a direct current is supplied to form a magnetic field.

In the configuration, in a state where the gas for processing is introduced into the processing chamber 104 from the gas introduction holes 102a of the shower plate 102, the microwave electric field generated from the electric field generating power source 106 propagates inside the waveguide 105, passes through the dielectric window 103 and the shower plate 102, and is supplied to the processing chamber 104 from above to below. The magnetic field generated by the direct current supplied to the magnetic field generating coil 107 is supplied into the processing chamber 104 and interacts with the microwave electric field to generate the electron cyclotron resonance (ECR). Atoms or molecules of the gas for processing are excited, dissociated, or ionized by the ECR to generate the plasma 116 having a high density in the processing chamber 104.

Figure 2:
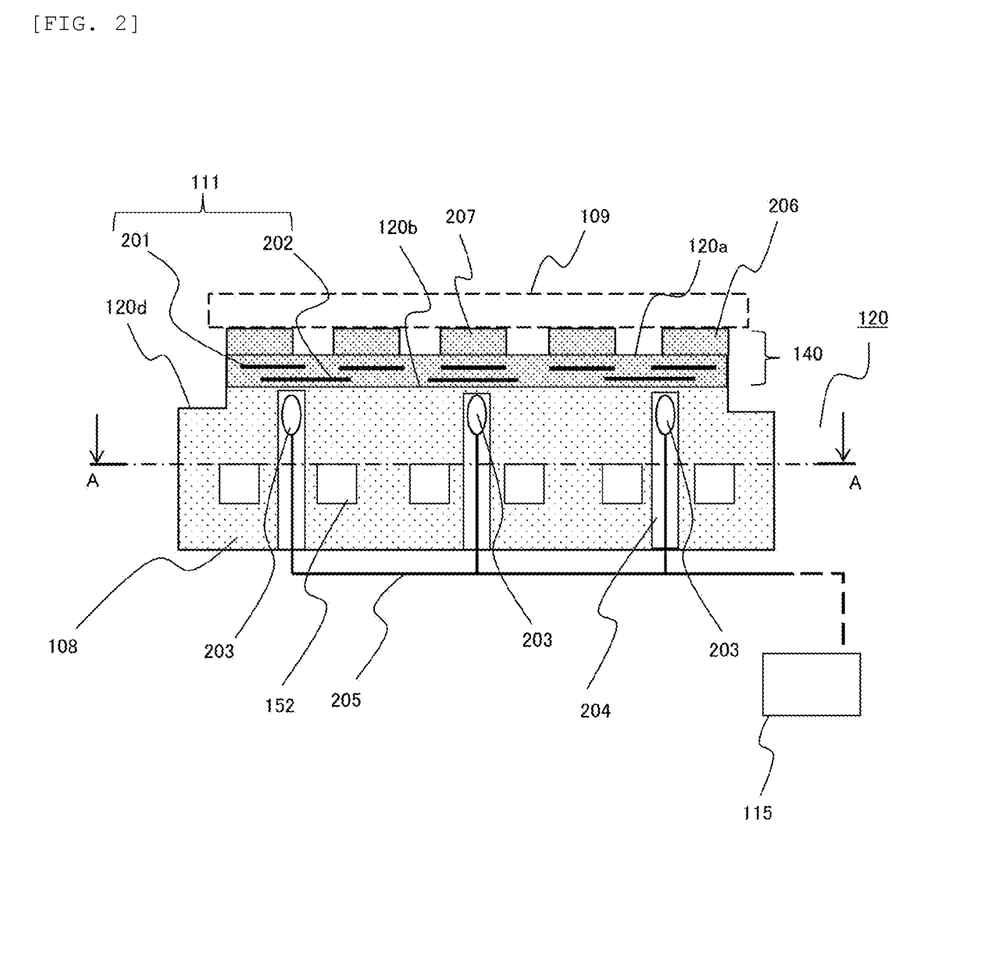
FIG. 2 is a vertical cross-sectional view schematically illustrating a configuration of a main portion of a wafer placing electrode according to the embodiment illustrated in FIG. 1.

A wafer placing electrode 120 forming a sample table is arranged at a lower portion of the processing chamber 104 below a space where the plasma 116 is formed. In FIG. 2, a central portion of an upper portion of the wafer placing electrode 120 is provided with a cylindrical projection portion (protrusion portion) whose upper surface is higher than an outer peripheral side, and the upper surface of the protrusion portion is provided with a placement surface 120a on which a semiconductor wafer (hereinafter, simply referred to as a wafer) 109, which is a sample (processed object), is placed. The placement surface 120a faces the shower plate 102 or the dielectric window 103.

Also as illustrated in FIG. 2, an upper surface 120b of a protrusion portion arranged in an upper central portion of an electrode base member (simply referred to as a base member) 108 forming a portion of the wafer placing electrode 120 is covered with a dielectric film 140, and the dielectric film 140 forms the placement surface 120a. A conductor film 111, which is a film made of a plurality of conductors for electrostatic adsorption that are connected to a direct current power source 126 via a radio frequency filter 125 illustrated in FIG. 1, is arranged inside the dielectric film 140.

Here, the conductor film 111 includes film-shaped electrostatic adsorption electrodes into which direct current power for semiconductor wafer adsorption caused by static electricity is supplied and which form the static electricity to adsorb the wafer 109 by sandwiching an upper portion of the dielectric film 140 covers the conductive film 111. The electrostatic adsorption electrodes of the conductor film 111 according to the present embodiment are a plurality of films which have a circular shape or a similar shape thereof that can be regarded as a circle when viewed from above, and which are arranged by a predetermined distance and insulated from each other. The electrostatic adsorption electrodes may be bipolar electrodes in which different polarity are imparted to one of a plurality of film-shaped electrodes and the other thereof, or may be unipolar electrodes in which the same polarity is imparted. Although only a single conductor film 111 is disclosed in FIG. 1, as bipolar electrostatic adsorption electrodes according to the present embodiment, a plurality of film-shaped metal electrodes, each with different polarity, are arranged inside the dielectric film 140.

In FIG. 1, the electrode base member 108, which is made of a conductor and has a circular or cylindrical shape and is arranged inside the wafer placing electrode 120, is connected to a radio frequency power source 124 via a matching device 129 through a power supply path including wires such as a coaxial cable. The radio frequency power source 124 and the matching device 129 are arranged at positions, a distance between which is smaller than a distance between the radio frequency filter 125 and the conductor film 111. The radio frequency power source 124 is connected to a grounding portion 112.

In the present embodiment, during the processing of the wafer 109, radio frequency power having a predetermined frequency is supplied from the radio frequency power source 124, so that the wafer 109 is adsorbed and held on an upper surface of the dielectric film 140 of the wafer placing electrode 120. A bias potential having a distribution corresponding to a difference between the bias potential and a potential of the plasma 116 is formed above the held wafer 109. In other words, the sample table includes the wafer placing electrode 120 to which the radio frequency power is supplied from the radio frequency power source 124 during the formation of the plasma 116.

Although details are described hereinafter, a refrigerant flow path 152 is arranged inside the electrode base member 108 for the purpose of removing transferred heat and cooling the wafer placing electrode 120. The refrigerant flow path 152 is arranged multiple times in a spiral shape or a concentric shape around a central axis of the electrode base member 108 or the wafer placing electrode 120 in the vertical direction, and a refrigerant whose temperature is adjusted to a predetermined range flows through the refrigerant flow path 152. An inlet and an outlet of the refrigerant flow path 152 to the wafer placing electrode 120 are connected by a pipeline to a temperature adjuster that includes a refrigerating cycle (not illustrated) and adjusts the temperature of the refrigerant within a predetermined range by heat transfer. The refrigerant whose temperature has changed due to heat exchange while flowing through the refrigerant flow path 152 flows out of the outlet and passes through a flow path inside the temperature adjuster through the pipeline to reach a temperature within a predetermined temperature range, and then returns to the refrigerant flow path 152 in the electrode base member 108 and circulates.

A recessed portion 120d is arranged on an outer peripheral side of the placement surface 120a having a circular shape similar to that of the wafer 109 on the protrusion portion of the electrode base member 108 of the wafer placing electrode 120. The recessed portion 120d surrounds the outer peripheral side of the placement surface 120a and is arranged in a ring shape when viewed from above. A susceptor ring 113 (FIG. 1) is placed on a ring-shaped upper surface of the recessed portion 120d formed at a height lower than that of the placement surface 120a of the sample table. The susceptor ring 113 is a ring-shaped member made of a dielectric material such as ceramics, for example, quartz or alumina, and covers a bottom surface of the recessed portion 120d or a cylindrical side wall surface of the protrusion portion with respect to the plasma 116.

Regarding the susceptor ring 113 according to the present embodiment, as illustrated in FIG. 1, the susceptor ring 113 is placed on the recessed portion 120d, and in this state, a cylindrical side wall portion forming an outer peripheral edge of the ring-shaped portion has such a dimension that a lower end of the side wall portion extends below the recessed portion 120d to cover the electrode base member 108 of the wafer placing electrode 120 or a cylindrical side wall surface of an insulating plate. In a state where the susceptor ring 113 is placed on the recessed portion 120d and a bottom surface of the ring-shaped portion is in contact with the recessed portion 120d or an upper surface of a protective dielectric film covering the recessed portion 120d, a flat upper surface of the susceptor ring 113 has a dimension higher than that of the placement surface 120a.

The plasma processing apparatus 100 according to the present embodiment includes devices for adjusting operations of the plasma processing apparatus 100, which include: a device for adjusting the electric field and the magnetic field such as the electric field generating power source 106, the magnetic field generating coil 107, the radio frequency power source 124, the radio frequency filter 125, the direct current power source 126, a radio frequency power source 127, a matching device 128, the matching device 129, and a load impedance variable box 130; a device constituting a pressure adjustment system, such as the vacuum exhaust device or a mass flow controller for adjusting a gas supply amount, which is described hereinafter; and a temperature adjustment mechanism such as a temperature adjuster for adjusting the heat generation amount of a heater inside the wafer placing electrode 120 and the temperature of the refrigerant supplied to the refrigerant flow path 152 and circulates therein.

Each of these apparatuses includes a detector for detecting a state of an operation such as an output, a flow rate, or a pressure, and is communicably connected to a controller 170 in a wired or wireless manner. When a signal indicating the state of the operation output from the detector of each of these apparatuses is transmitted to the controller 170, a calculator of the controller 170 reads software stored in a storage device inside the controller 170, detects the amount of the state based on the received signal from the detector based on an algorithm, and calculates and transmits a command signal for adjusting the amount of the state to an appropriate value. The apparatus of the electric field and magnetic field adjustment system or the pressure adjustment system that receives the command signal adjusts the operation according to the command signal.

Although details are described hereinafter, in a vacuum processing apparatus including such a plasma processing apparatus 100, a wafer transferring robot is arranged in a vacuum transferring chamber, which is depressurized to a pressure equal to that of the processing chamber 104, inside a vacuum transferring container that is another vacuum container connected to the side wall of the vacuum container 101. When a gate valve, whose gate as a passage communicating between the vacuum transferring chamber and the processing chamber 104 is arranged in the vacuum transferring chamber, is opened, the wafer 109 before processing is placed on a distal end of a robot arm and is carried into the processing chamber 104 through the gate by extension of the arm. The wafer 109 transferred above the placement surface 120a of the wafer placing electrode 120 in the processing chamber 104 is delivered onto a lift pin by moving the lift pin up and down, and after the wafer 109 is further placed on the placement surface 120a, the wafer 109 is adsorbed to and held on the placement surface 120a of the wafer placing electrode 120 by an electrostatic force formed by the direct current power applied from the direct current power source 126.

After the transferring robot leaves from the processing chamber 104 and enters the vacuum transferring chamber by contraction of the arm, the gate is airtightly closed by the gate valve from the vacuum transferring chamber to seal the inside of the processing chamber 104. In this state, the gas for the etching processing is supplied into the processing chamber 104 through a gas supplying pipeline configured with a pipe connecting a gas source and the vacuum container 101. The pipe is provided with a mass flow controller (not illustrated). The mass flow controller is a flow path adjuster including a flow path through which the gas flows, and a valve that is arranged on the flow path and increases or decreases a cross-sectional area of the flow path or opens or closes the flow path to adjust a flow rate to a value within a desired range. The gas whose flow rate or speed is adjusted by the mass flow controller is introduced into a gap space between the dielectric window 103 and the quartz shower plate 102 from the flow path in the vacuum container 101 connected to an end portion of the pipe. The introduced gas is diffused in this space and then introduced into the processing chamber 104 through the gas introduction holes 102a of the shower plate 102.

The gas and particles inside the processing chamber 104 are exhausted through the vacuum exhaust port 110 by an operation of the vacuum exhaust device connected to the vacuum exhaust port 110. The pressure inside the processing chamber 104 is adjusted to a predetermined value within a range suitable for the processing of the wafer 109 according to a balance between the gas supply amount from the gas introduction holes 102a of the shower plate 102 and an exhaust gas amount from the vacuum exhaust port 110.

Further, when the wafer 109 is adsorbed and held, a gas having a heat transferring property such as He (helium) is supplied from an opening (not illustrated) on the upper surface of the dielectric film 140 into a gap between the wafer 109 and the upper surface of the dielectric film 140, which is the placement surface 120a of the wafer placing electrode 120, and accordingly, heat transfer between the wafer 109 and the wafer placing electrode 120 is promoted. The refrigerant adjusted to have a temperature within the predetermined range flows and circulates in the refrigerant flow path 152 arranged in the electrode base member 108 of the wafer placing electrode 120, so that a temperature of the wafer placing electrode 120 or the electrode base member 108 is adjusted in advance before the wafer 109 is placed. Therefore, by transferring heat between the wafer 109 and the wafer placing electrode 120 or the electrode base member 108 having a large heat capacity, a temperature of the wafer 109 is adjusted to be close to the temperature of the wafer placing electrode 120 or the electrode base member 108 before processing, and even after the start of the processing, heat from the wafer 109 is transferred to adjust the temperature of the wafer 109.

Hereinafter, the etching is described. In the state, the microwave electric field and the magnetic field are supplied into the processing chamber 104, and the plasma 116 is generated by using the gas. When the plasma 116 is formed, the radio-frequency (RF) power is supplied to the electrode base member 108 from the radio frequency power source 124, the bias potential is formed above the upper surface of the wafer 109, and charged particles, such as ions, in the plasma 116 are attracted to the upper surface of the wafer 109 according to a potential difference between the bias potential and the potential of the plasma 116. Further, a film structure including a mask and a film layer to be processed is provided on the upper surface of the wafer 109 in advance, and the charged particles collide with a surface of the film layer to be processed, thereby performing the etching processing. During the etching processing, the gas for processing that is introduced into the processing chamber 104 and particles of a reaction product generated during the processing are exhausted from the vacuum exhaust port 110.

When the etching processing of the film layer to be processed progresses and an end point detector or a film thickness detector (not illustrated) detects that the processing has reached a predetermined etching amount or a remaining film thickness, the supply of the radio frequency power from the radio frequency power source 124 is stopped, and further, supply of power to the electric field generating power source 106 and the magnetic field generating coil 107 is stopped. Accordingly, the plasma 116 is deenergized, and the etching processing is stopped. Then, the electrostatic adsorption electrodes of the conductor film 111 adsorbing the wafer 109 are subjected to electricity elimination processing of an electrostatic adsorption force such as supplying power from the direct current power source 126 to make the potential to be opposite to that during processing.

A diluting gas is introduced into the processing chamber 104 to replace the processing gas. Thereafter, the wafer 109 is lifted from the placement surface 120a of the wafer placing electrode 120 by the lift pin, and then the wafer 109 is delivered to the distal end of the arm of the transferring robot that has entered the processing chamber 104 through the gate opened by the gate valve, and is carried out of the processing chamber 104 by the contraction of the arm. If there is another wafer 109 to be processed, the wafer 109 is carried in by the transferring robot and is processed in the same manner as above, and if there is no another wafer 109, the gate is airtightly closed by the gate valve to seal the processing chamber 104, and the processing in the processing chamber 104 is completed.

Then, in the plasma processing apparatus 100 according to the present embodiment, during the processing of the wafer 109, second radio frequency power is supplied from the radio frequency power source 127, which is a second radio frequency power source, to a conductor ring 131 arranged between the recessed portion 120d on the outer periphery of the placement surface 120a of the wafer placing electrode 120 and the susceptor ring 113. The conductor ring 131 is arranged in a through hole forming a power supply path of the second radio frequency power and penetrating an inside of an outer peripheral portion of the electrode base member 108 of the wafer placing electrode 120, and is connected to a power supply connector 161 that is pressed upward from below against the conductor ring 131 and is held on the conductor ring 131.

The radio frequency power output from the radio frequency power source 127 is supplied to the conductor ring 131, which is made of a conductor and arranged on an inner side of the susceptor ring 113, along the power supply path electrically connecting the radio frequency power source 127 and the conductor ring 131 through the load matching device 128 and the variable load impedance box 130 that are arranged on the power supply path.

At this time, impedance on the power supply path is adjusted to a value within a suitable range in the load impedance variable box 130, so that a value of the impedance for a first radio frequency power from the radio frequency power source 127 to an outer peripheral edge portion of the wafer 109 through the electrode base member 108 is relatively low with respect to a part having relatively high impedance of an upper portion of the susceptor ring 113. Accordingly, the radio frequency power is effectively supplied to the outer peripheral side portion and the outer peripheral edge portion of the wafer 109, and concentration of an electric field on the outer peripheral side portion or the outer peripheral edge portion of the wafer 109 is relieved. In addition, a distribution of heights of equipotential surfaces of the bias potentials above these regions is set within a desired range in which variations in an incidence direction of the charged particles, such as ions, in the plasma to the upper surface of the wafer 109 are allowed, and a processing yield is improved.

In the present embodiment, the radio frequency power source 127 is electrically connected to a grounding portion 112. In this example, a frequency of the second radio frequency power supplied to the conductor ring 131 from the radio frequency power source 127 is appropriately selected according to processing conditions of the wafer 109, and is preferably equal to or a constant multiple of that of the radio frequency power source 124.

FIG. 2 is a vertical cross-sectional view schematically illustrating a configuration of a main portion of the wafer placing electrode according to the embodiment illustrated in FIG. 1. In FIG. 2, the wafer placing electrode 120 of the plasma processing apparatus 100 according to the present embodiment includes the electrode base member 108 which is a metal disk-shaped base member and to which radio frequency bias power is supplied, and the dielectric film 140 that is arranged on an upper surface of the electrode base member 108 and is made of ceramics, such as alumina and yttria, as a material. The configuration of the main portion of the wafer placing electrode 120 is described in detail.

In FIG. 2, the dielectric film 140 arranged on the upper portion of the metal electrode base member 108, which is the base member of the wafer placing electrode 120, covers the upper surface of the protrusion portion arranged in the central portion of the upper portion of the electrode base member 108, and includes the film-shaped conductor film 111 that forms two layers in the vertical direction inside the dielectric film 140. Lower-layer film-shaped electrodes in the conductor film 111 are heater electrodes 202 occupying a plurality of regions (zones) on the upper surface of the protrusion portion or the dielectric film 140 when viewed from above. In the present embodiment, the heater electrodes 202 are arranged in a manner of substantially occupying each region in a central circular region including a center of the dielectric film 140 and a plurality of ring-shaped regions that surround the central circular region on an outer peripheral side and are concentrically arranged with respect to the center. Each of the ring-shaped regions occupied by the heater electrodes 202 is divided into a plurality of (three or more in this example) arc-shaped small regions around the center, and the heater electrodes 202 occupy each small region. That is, the heater electrodes 202 according to the present embodiment are arranged in the circular zone in the central portion and the plurality of arc-shaped zones around the circular zone in the dielectric film 140 and substantially occupy an area equal to that of these zones, and cover the entire upper surface of the protrusion portion of the electrode base member 108.

Meanwhile, upper-layer film-shaped electrodes in the conductor film 111 are electrostatic adsorption electrodes (ESC electrodes) 201 occupying a circular region including the center of the dielectric film 140 and at least one ring-shaped region that concentrically surrounds the circular region on the outer peripheral side of the circular region with respect to the center. In the wafer placing electrode 120 or a radial direction from the center in this example, positions where two adjacent ESC electrodes are separated are also located so as to have the same specific radius with respect to the center, and are concentrically separated from each other. Regarding the separation positions, two adjacent ring-shaped regions where the heater electrodes 202 are arranged are overlapped with the positions that are concentrically separated at the same specific radial position with respect to the center, and one contains a projected region of the other when viewed from above.

Each of the plurality of ESC electrodes 201 according to the present embodiment is connected with the direct current power source 126, and voltages determined according to the command signal from the controller 170 are applied to the ESC electrodes 201 so as to impart a polarity corresponding to the voltages. Charges are accumulated in an upper region of each electrode in the wafer 109 above the wafer placing electrode 120 depending on the polarity corresponding to the voltage, and the electrostatic force is generated. The plurality of ESC electrodes 201 of this example are imparted either positive or negative polarity, and form a so-called bipolar type electrode in which pairs of positive and negative electrodes are mutually formed. A sum of areas of the ESC electrodes 201 to which each of the positive and negative polarities is imparted is formed into a shape having the same value or a value approximate to the same value.

In the wafer placing electrode 120 according to present embodiment, a plurality of temperature sensors 203 for detecting the temperature of the electrode base member 108 are arranged in each region where the heater electrode 202 is arranged or in each projected region of the zones in the dielectric film 140 when viewed above, which are inside the electrode base member 108. The refrigerant flow path 152 arranged concentrically or spirally around a central axis of the wafer placing electrode 120 in a vertical direction is arranged at a position, which is below distal end portions of the temperature sensors 203 for detecting the temperature, inside the electrode base member 108. Therefore, the temperature of the electrode base member 108 or the wafer placing electrode 120 is adjusted not only by the heat generated by the heater electrodes 202 but also by the refrigerant adjusted to have a predetermined temperature, which circulates and flows inside the refrigerant flow path 152.

In this example, one temperature sensor 203 corresponding to each heater electrode 202 in each zone may be inserted into and stored in a sensor hole 204 arranged inside the electrode base member 108 below the zone. Further, as illustrated in the present embodiment, the temperature sensor corresponding to each circular or ring-shaped region may be stored one by one in each sensor hole 204 arranged at a position within the projected range of the region.

The placement surface 120a above the ESC electrodes 201 of the dielectric film 140 includes a ring-shaped protrusion portion 206 arranged on the outermost peripheral edge portion and surrounding the inside, and a plurality of protrusion portions 207 arranged on the upper portion of the dielectric film 140 on an inner side of the protrusion portion 206. Upper surfaces of these protrusion portions abut on a back surface of the wafer 109, which is placed on and electrostatically adsorbed to the upper surface of the dielectric film 140, and press against the back surface of the wafer 109. When the direct current power is supplied from the direct current power source 126 to the ESC electrodes 201 inside the dielectric film 140 and a specific potential is imparted to the ESC electrodes 201, molecules or atoms in a member including the back surface of the wafer 109 are polarized according to charges inside the ESC electrodes 201 to generate charges. The electrostatic force is generated in a manner of sandwiching the dielectric material of the dielectric film 140 above the ESC electrodes. Accordingly, an attractive electrostatic force is generated between the wafer 109 and the ESC electrode 201, and as a result, the wafer 109 is adsorbed onto the dielectric film 140 with a predetermined adsorption force.

Meanwhile, below a bottom portion of the vacuum container 101, an exhaust apparatus, which includes a vacuum pump including a turbo molecular pump and a roughing pump such as a rotary pump, is connected to the bottom portion and is configured to communicate with the processing chamber 104 via the vacuum exhaust port 110 at the bottom portion of the vacuum container 101. By driving the vacuum pump, the pressure inside the processing chamber 104 is maintained at a high vacuum level with the wafer 109 arranged therein. Generally, the pressure in the processing chamber 104 during the processing of the wafer 109 is set to a value within a range suitable for the processing of the wafer 109 according to a balance between a flow rate or a speed of a supply of a mixed gas of the processing gas from a processing gas supplying path and the diluting gas and a flow rate or a speed of an exhaust gas from the vacuum exhaust port 110.

In the plasma processing apparatus 100, in a state where the wafer 109 is adsorbed to and held by the upper surface of the dielectric film 140, a gas having a high heat transferring property, such as He gas from the gas source, is supplied to the gap between the wafer 109 and the upper surface of the dielectric film 140 (hereinafter, also referred to as a gap) through a gas passage (not illustrated), and the heat transfer between the wafer 109 and the refrigerant circulating and flowing in the refrigerant flow path 152 formed in the electrode base member 108 is promoted.

The etching processing of the film layer to be processed on one wafer 109 performed in the present embodiment includes a plurality of steps having different processing conditions including the temperature range suitable for performing the etching processing, and includes, between a previous step and a subsequent step in the etching processing, a transition step for transitioning the temperature of the wafer 109 or the temperature of the wafer placing electrode 120 or the upper surface of the dielectric film 140 on which the wafer 109 is placed and held from conditions of the previous step to conditions of the subsequent step.

Figure 3:
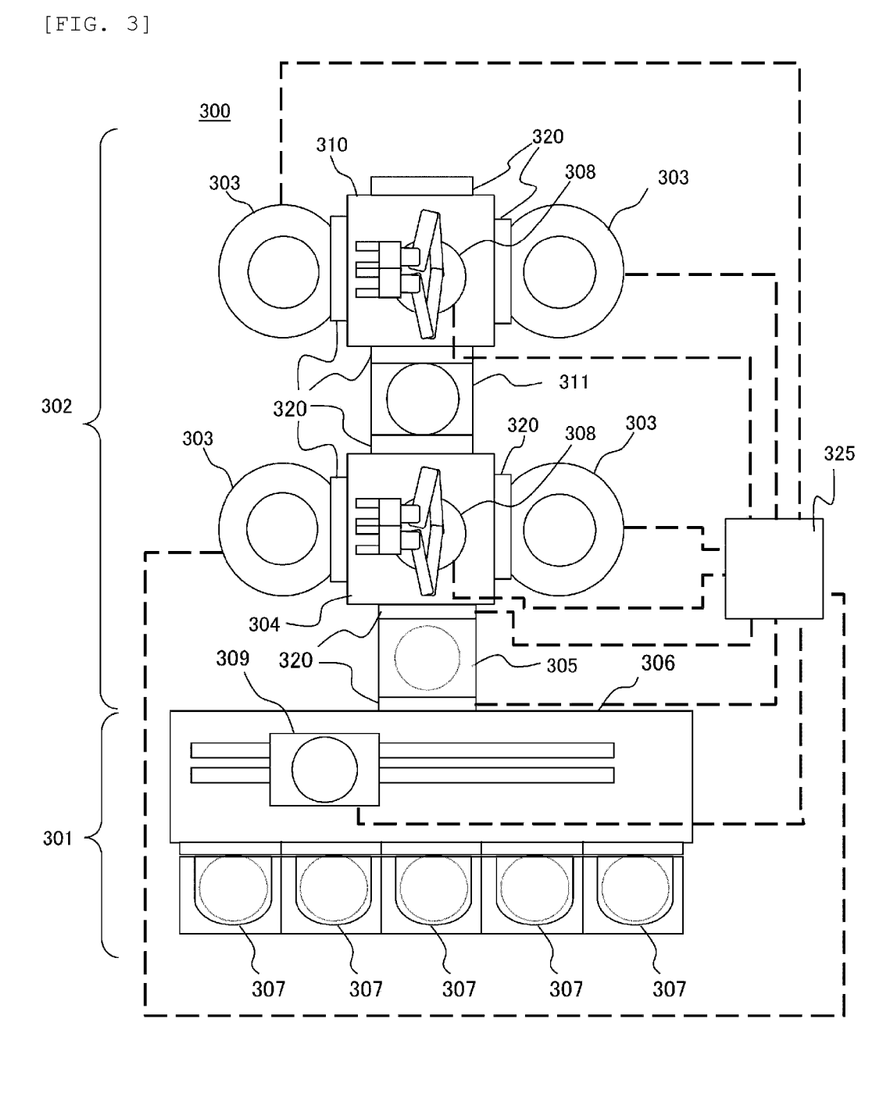
FIG. 3 is a top view schematically illustrating an outline of a configuration of a vacuum processing apparatus including the plasma processing apparatus according to the embodiment illustrated in FIG. 1 as a processing unit.

A configuration of a vacuum processing apparatus 300 including the plasma processing apparatus according to the embodiment of the invention is described with reference to FIG. 3. FIG. 3 is a top view schematically illustrating an outline of the configuration of the vacuum processing apparatus including the plasma processing apparatus according to the embodiment illustrated in FIG. 1 as a processing unit.

The vacuum processing apparatus 300 illustrated in this figure is roughly divided into an atmospheric side block 301 and a vacuum side block 302. The atmospheric side block 301 is a part that transfers, stores and positions a substrate-like wafer such as the semiconductor wafer, which is an object to be processed, under an atmospheric pressure. The vacuum side block 302 is a block that transfers the substrate-like wafer such as the wafer under a pressure depressurized from the atmospheric pressure and performs processing in a predetermined vacuum processing chamber. Between a position of the vacuum side block 302 where the transferring and processing of the vacuum side block 302 are performed and the atmospheric side block 301, an apparatus, which connects the vacuum side block 302 and the atmospheric side block 301 and change a pressure between the atmospheric pressure and a vacuum pressure in a state where the wafer is held therein, is arranged.

The atmospheric side block 301 includes a housing 306, which is a substantially rectangular parallelepiped container provided with an atmospheric transferring robot 309 therein, has an inner pressure that is equal to or slightly higher than a pressure of atmosphere that is an atmosphere around the vacuum processing apparatus 300, and includes, on an inner side, an atmospheric transferring chamber into which wafers before and after the processing are transferred. A front surface side of the housing 306 is provided with a plurality of cassette tables 307 on which a cassette is placed. The cassette stores the substrate-like wafer, such as the semiconductor wafer to be processed, for processing or cleaning.

The vacuum side block 302 is provided with one or more lock chambers 305 that are arranged between a first vacuum transferring chamber 304 and the atmospheric side block 301, and exchange a pressure between the atmospheric pressure and the vacuum pressure in a state where the wafer that is transferred between the atmosphere side and the vacuum side is held therein.

The first vacuum transferring chamber 304 and a second vacuum transferring chamber 310 are units each including a vacuum container having a substantially rectangular shape in a plan view, and these are two units that have structural differences to an extent that they can be regarded as substantially the same. A vacuum transferring intermediate chamber 311 is a vacuum container whose inside can be depressurized to a vacuum level equivalent to that of another vacuum transferring chamber or vacuum processing chamber, and connects the vacuum transferring chambers 304 and 310 so that the vacuum transferring chambers 304 and 310 can communicate with each other. Gate valves 320 are arranged between the vacuum transferring chambers 304 and 310, and the gate valves 320 open, block, and divide passages which allow the internal chambers to communicate and in which the wafer is transferred. By closing these gate valves 320, the vacuum transferring intermediate chamber 311 and the vacuum transferring chambers 304 and 310 are airtightly sealed.

In the chamber inside the vacuum transferring intermediate chamber 311, a storage unit for holding a plurality of wafers horizontally with a gap between surfaces of the plurality of wafers is arranged, and when the wafer is delivered to and from the vacuum transferring chambers 304 and 310, the storage unit functions as a relay chamber where the wafer is temporarily stored. That is, the wafer, which is carried in by a vacuum transferring robot 308 in one vacuum transferring chamber and is placed on the storage unit, is carried out by a vacuum transferring robot 308 in the other vacuum transferring chamber and is transferred into a vacuum processing unit 303 or the lock chamber 305 which is connected to the vacuum transferring chamber.

The vacuum processing units 303 each including the plasma processing apparatus 100 illustrated in FIG. 1 are connected to other surfaces of the first vacuum transferring chamber 304 and the second vacuum transferring chamber 310 different from surfaces connected with the vacuum transferring intermediate chamber 311. In the present embodiment, as described above, the vacuum processing unit 303 is a unit including the vacuum container 101, sections for generating the electric field and the magnetic field supplied to form the plasma 116 in the processing chamber 104 inside the vacuum container 101, and an exhaust section including the vacuum pump for exhausting the processing chamber 104 that is a depressurized space inside the vacuum container 101, and performs the etching processing by using the plasma 116 in the internal processing chamber 104.

In the vacuum processing apparatus 300 of this example, two vacuum processing units 303 are connected to each of the first vacuum transferring chamber 304 and the second vacuum transferring chamber 310. In these vacuum processing units 303, not only the etching processing of the wafer 109 but also ashing processing or other processing to be performed on another semiconductor wafer may be performed. Further, each vacuum processing unit 303 may be connected to the pipeline through which the processing gas supplied to the processing chamber 104 inside the vacuum container 101 flows according to processing to be performed.

At most two vacuum processing units 303 can be connected to the first vacuum transferring chamber 304, and in the present embodiment, two vacuum processing units 303 are connected. Meanwhile, at most three vacuum processing units 303 can be connected to the second vacuum transferring chamber 310, and in the present embodiment, up to two vacuum processing units 303 are connected.

The insides of the first vacuum transferring chamber 304 and the second vacuum transferring chamber 310 are defined as a transferring chamber. In the first vacuum transferring chamber 304, a vacuum transferring robot 308 for transferring the wafer between the lock chamber 305 and either one of the vacuum processing unit 303 and the vacuum transferring intermediate chamber 311 under vacuum is arranged at a central part of the space inside the first vacuum transferring chamber 304. Similarly, in the second vacuum transferring chamber 310, the vacuum transferring robot 308 is arranged at a central part inside the second vacuum transferring chamber 310, and can transfer the wafer between the second vacuum transferring chamber 310 and either one of the vacuum processing unit 303 and the vacuum transferring intermediate chamber 311.

The wafer is placed on the arm of the vacuum transferring robot 308, and in the first vacuum transferring chamber 304, the vacuum transferring robot 308 carries in and out the wafer between a wafer table (for example, the wafer placing electrode) arranged in the vacuum processing unit 303 and either one of the lock chamber 305 and the vacuum transferring intermediate chamber 311. The passage is provided to make the vacuum processing unit 303, the lock chamber 305, the vacuum transferring intermediate chamber 311, and the transferring chambers of the first vacuum transferring chamber 304 and the second vacuum transferring chamber 310 communicate with each other by the gate valves 320 that can be airtightly closed and opened separately, and this passage is opened and closed by these gate valves 320.

In the vacuum processing apparatus according to the embodiment illustrated in FIG. 3, the processing for the wafer is performed under the same conditions including the processing time for all the vacuum processing units 303. The number of wafers that can be transferred per unit time in the lock chamber 305 is less than the number of wafers that can be processed per unit time in the vacuum processing unit 303, and is a value equal to or slightly less than the number of wafers that are transferred per unit time by the vacuum transferring robot 308 arranged in each vacuum transferring chamber. This is because, when the wafer upon the processing in the lock chamber 305 is carried out to the atmospheric side block 301, a long time is required to lower the temperature of the wafer, which has been subjected to the heat processing such as the ashing processing, to such an extent that no trouble occurs in transferring and storage to the cassette, and a time during which the wafer is retained in the lock chamber 305 is relatively long.

The vacuum transferring robot 308 (referred to as a robot 1) arranged in the first vacuum transferring chamber 304 is a machine for delivering an unprocessed wafer, which is introduced from the atmospheric side block 301 to the vacuum side block 302, between the lock chamber 305 and each target vacuum processing unit 303 which is subjected to preset processing before the wafer is transferred. Meanwhile, the vacuum transferring robot 308 (referred to as a robot 2) arranged in the second vacuum transferring chamber 310 is a machine for delivering the wafer, which is transferred from the first vacuum transferring chamber 304 to the vacuum transferring intermediate chamber 311 by the robot 1, between the vacuum transferring intermediate chamber 311 and any one of the vacuum processing units 303 connected to the second vacuum transferring chamber 310.

In the present embodiment, upon completion of the processing of the wafer in any of the vacuum processing units 303, a processed wafer is transferred from the vacuum processing unit 303 toward the lock chamber 305. Here, as described above, the time required to transfer the wafer to the atmospheric block from the lock chamber 305, that is, the residence time of the wafer in the lock chamber 305 from a timepoint when the pressure of the inside of the lock chamber 305 is raised from a depressurized state to a pressure that is equal to the atmospheric pressure or can be regarded as the atmospheric pressure until the wafer is taken out after the gate valve facing the atmospheric side block 301 is opened, is sufficiently longer than the time from a timepoint when the wafer is carried into the vacuum processing unit 303 until the wafer is taken out after being processed. Therefore, in the present embodiment, the robot 1 needs to return all the processed wafers to the lock chamber 305, and thus a waiting time is needed before the gate valve on the vacuum side block 302 side of the lock chamber 305 is opened and the processed wafers can be carried in while the processed wafers are held by the arm of the robot 1.

Figure 4:
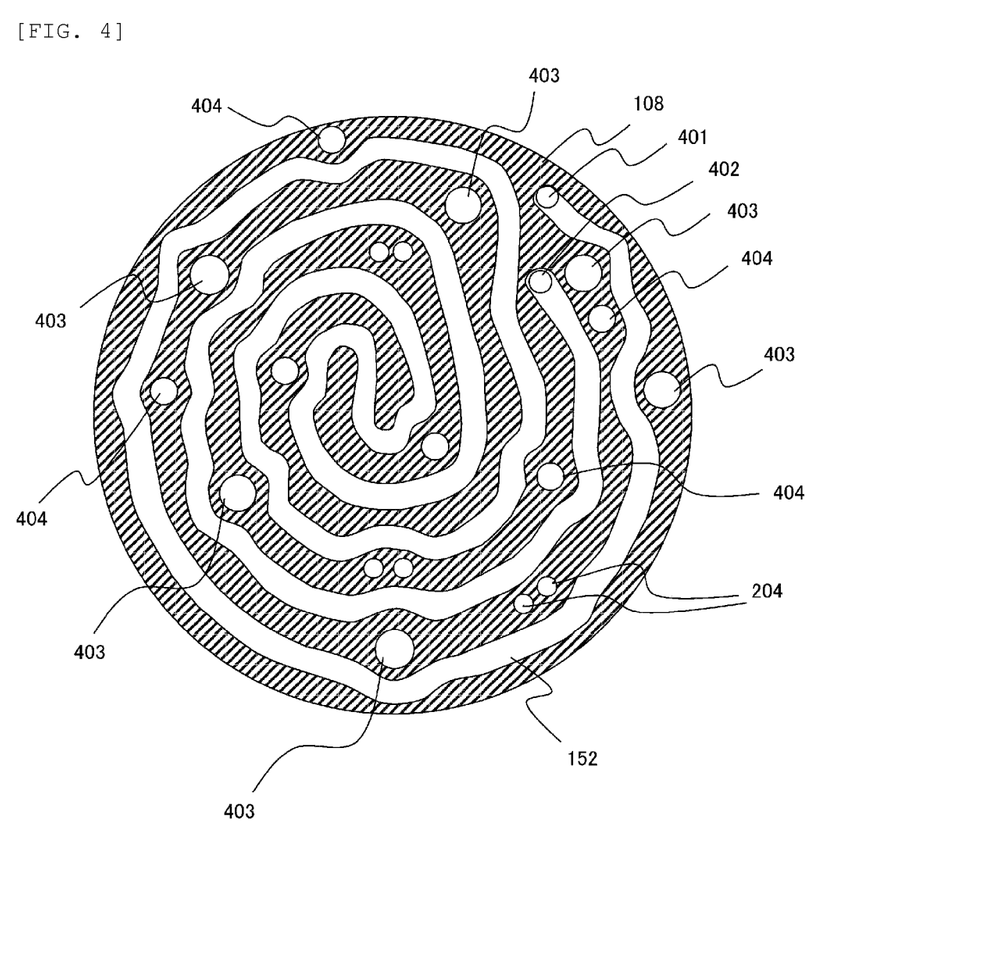
FIG. 4 is a horizontal cross-sectional view illustrating an internal configuration of a metal base member of the wafer placing electrode according to the embodiment illustrated in FIG. 2.

An internal structure of the electrode base member 108 of the wafer placing electrode 120 illustrated in FIG. 2 is described with reference to FIG. 4. FIG. 4 is a horizontal cross-sectional view illustrating the internal configuration of a metal base member of the wafer placing electrode according to the embodiment illustrated in FIG. 2. In particular, FIG. 4 illustrates a horizontal cross section of the electrode base member 108 as illustrated by a line A-A illustrated in FIG. 2.

As illustrated in this figure, the electrode base member 108 according to the present embodiment is made of a metal such as aluminum or an alloy thereof, and titanium or an alloy thereof, and has a disc shape or a cylindrical shape, and includes the refrigerant flow path 152 arranged multiple times in a spiral shape or a concentrical shape around the center inside the electrode base member 108. The refrigerant flow path 152, which is arranged multiple times in the radial direction of this example, includes one end portion including an inflow port 401 through which the refrigerant flows inward from the outermost flow path portion, and is a path that swirls such that the refrigerant flowing in from the inflow port 401 approaches a central portion of the electrode base member 108 with a movement in a clockwise rotation direction around a center when viewed from above. In the example illustrated in FIG. 4, the refrigerant flow path 152 includes a path through which the refrigerant flows clockwise about three times along the flow path from the inflow port 401 and reaches the central portion of the electrode base member 108.

Further, the refrigerant flow path 152 includes a flow path that is folded back counterclockwise at the central portion of the electrode base member 108 and then swirls such that the refrigerant approaches an outer peripheral portion with a movement in a counterclockwise direction from the central portion, and the refrigerant flow path 152 includes, on an inner peripheral side of the outermost flow path, the other end portion positioned at a position close to the one end portion including the inflow port 401. The other end portion is provided with an outflow port 402 of the refrigerant, and the refrigerant, which has flowed through the inside of the refrigerant flow path 152 from the inflow port 401 and reached the central portion, flows counterclockwise about two times from a folded portion of the flow path to reach the other end portion of the refrigerant flow path 152, and flows out of the refrigerant flow path 152 through the outflow port 402.

In the present embodiment, the inside of the electrode base member 108 is provided with through holes 403 in which a connector or a cable for supplying power to the electrostatic adsorption electrode 201 arranged inside the dielectric film 140 of the wafer placing electrode 120 is stored, through holes 404 in which a connector or a cable for supplying power to the heater electrode 202 is stored, and sensor holes 204 in which the temperature sensor 203 arranged between the upper surface of the electrode base member 108 and the refrigerant flow path 152 inside the electrode base member 108 is stored. The refrigerant flow path 152 avoids these through holes, and thus includes a plurality of positions that are locally meandering in a direction within a drawing surface at positions in the vicinity of these through holes.

The electrode base member 108 of this example has a disk shape in which a dimension in a radial direction (horizontal direction) is sufficiently greater than a dimension in a thickness direction (vertical direction). Therefore, a dimension in a radial direction is sufficiently greater than a dimension in a vertical direction of a region where the refrigerant flow path 152 arranged inside the electrode base member 108 is present.

Figure 5:
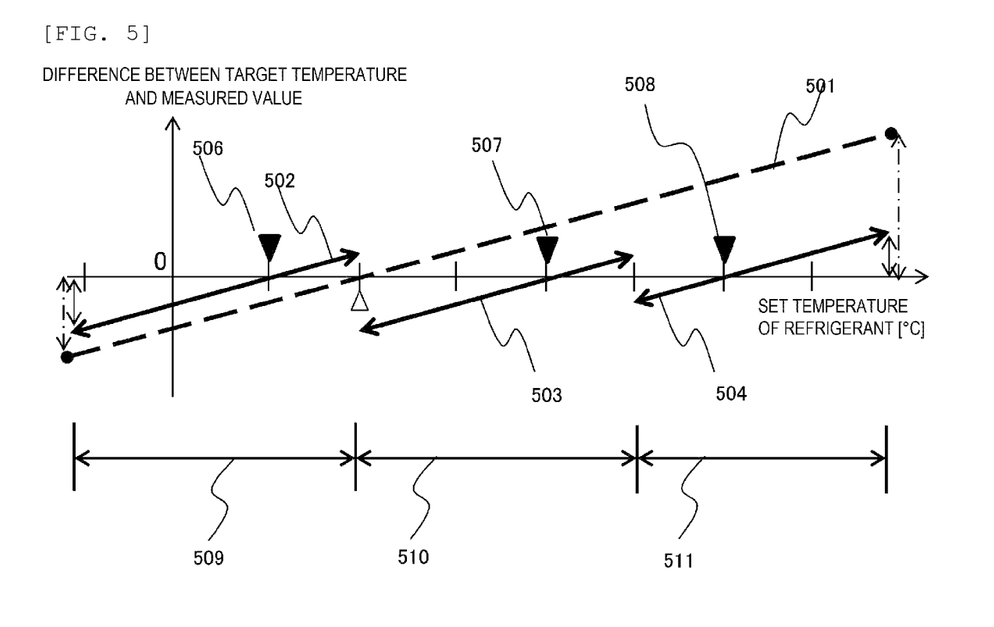
FIG. 5 is a graph schematically illustrating a relation between a change in a temperature of a refrigerant supplied to a refrigerant flow path according to the embodiments illustrated in FIGS. 2 and 4 and a difference between a detection result of a temperature sensor of the wafer placing electrode and an actual temperature of the wafer placing electrode.

Next, a mode of adjusting the temperature of the wafer placing electrode 120 of the plasma processing apparatus illustrated in FIG. 1 is described with reference to FIG. 5. FIG. 5 is a graph schematically illustrating a relation between a change in the temperature of the refrigerant supplied to the refrigerant flow path according to the embodiment illustrated in FIGS. 2 and 4 and a difference between a detection result of the temperature sensor of the wafer placing electrode and an actual temperature of the wafer placing electrode.

In the plasma processing apparatus according to the present embodiment, in a state where the wafer is placed and adsorbed on the wafer placing electrode 120, the temperature of the wafer changes according to the temperature of the refrigerant supplied to the refrigerant flow path 152 and the heat generation amount depending on the magnitude of the direct current power supplied to the heater electrode 202. Therefore, the controller 170 receives the output from the temperature sensor 203 and then transmits a command signal corresponding to a detected temperature value of the electrode base member 108 or an estimated temperature value of the wafer 109, and whereby the temperature of the refrigerant and the heat generation amount of the heater electrode 202 are adjusted. Meanwhile, in the temperature sensor 203 according to this example, for example, the temperature sensor 203 including a resistor, the magnitude of the difference (error) between the detected temperature and the actual temperature also increases or decreases depending on the level of the detected temperature value. Therefore, the controller 170 corrects the error of the detection of the temperature sensor 203 as described above by correcting the result obtained by receiving the output from the temperature sensor 203 by a predetermined amount, and detects the temperature of the wafer placing electrode 120 or the wafer 109 with a high accuracy.

Therefore, in this example, before the start of the processing of the wafer 109 which is a step of manufacturing a semiconductor device, the temperature of the refrigerant is set to a plurality of values for each predetermined range by the temperature adjuster of the refrigerant and the refrigerant is supplied to the refrigerant flow path of the wafer placing electrode 120, and whereby the electrode base member 108 is adjusted to have a plurality of different temperatures. In this manner, the temperature is detected by using the temperature sensor 203 in a state where the temperature of the electrode base member 108 is adjusted to each temperature, and the errors between the detected temperature and the actual temperature of the upper surface of the electrode base member 108 or the upper surface of the dielectric film 140 of the wafer placing electrode 120 are determined. Further, correlations between these error values and the set temperature values (set refrigerant temperatures) of the temperature adjuster of the refrigerant are extracted, and a coefficient indicating these correlations is calculated. A graph illustrating these correlations is FIG. 5.

As a result of studies, the inventors have found that the error of the temperature determined from the output of the temperature sensor 203 arranged inside the electrode base member 108 of the wafer placing electrode 120 in this example changes with a predetermined gradient with respect to the set values of the temperature, which are set by the temperature adjuster of the refrigerant, within a range assumed as an actual processing condition of the wafer 109, that is, the error can be substantially expressed as a linear function of the set temperature of the refrigerant.

Therefore, in the plasma processing apparatus according to the present embodiment, the temperature of the refrigerant is set to a plurality of values within the temperature range of the wafer 109 as an assumed processing condition by the temperature adjuster as described above in advance before starting the operation of processing the wafer 109 as a step of manufacturing the semiconductor device, and the correlation between the error of the output of the temperature sensor 203 and the set temperature of the refrigerant is applied to a linear function (y=ax+b), and in this case, values of the gradient (coefficient a) and a constant b are determined as parameters. Then, when the controller 170 estimates the value (y) of the function calculated from these parameters and the set value (x) of the temperature adjuster of the refrigerant as an error, and estimates or calculates the temperature of the wafer placing electrode 120 for the step of processing the wafer 109 as a product manufacturing step or the temperature of the wafer 109 placed on the wafer placing electrode 120, the controller 170 corrects or calibrates the temperature value detected from the output from the temperature sensor 203 by using the estimated error. The corrected temperature value is used for feedback control of the temperature adjuster and the heater electrode.

Further, in the present embodiment, the temperature range of the wafer 109 that is the assumed processing condition is divided into a plurality of continuous regions (three regions in FIG. 5) 509, 510, and 511, and correlation functions 502, 503, and 504 that are different linear functions having the same (gradient) coefficient a detected as the parameter for calibration and respectively having error 0 (zero cross) points 506, 507, and 508 within the respective temperature regions are set as an error calibration function for each temperature region. More specifically, the correlation function 502 is represented by $y=ax+b_1$ in the first region 509, the correlation function 503 is represented by $y=ax+b_2$ in the second region 510, and the correlation function 504 is represented by $y=ax+b_3$ in the third region 511. Here, any function passes through the point where y=0 in the corresponding region. The coefficient a is equal to the coefficient a of a single linear function indicating a relation between the error and the set temperature of the refrigerant over the entire range within which the temperature of the refrigerant can be adjusted.

Further, when an error between a temperature obtained from an output of a temperature sensor in a sample table of another plasma processing apparatus having substantially the same configuration as the plasma processing apparatus and the actual temperature of the base member or the wafer is used as a substitution error, the coefficient a may be equal to a coefficient a of a linear function indicating the relation between the substitution error and the set temperature of the refrigerant. The heat generation amount of the heater electrode 202 may be adjusted based on these correlation functions 502, 503, and 504.

By using the different calibration functions having the same coefficient for each of the plurality of divided temperature regions in this way, the error in each temperature region can be reduced. As illustrated in FIG. 5, it can be seen that, as compared with a comparative example where a correlation function 501 is used as the single linear function over the entire temperature range during processing that is assumed to be executed, a difference (corresponding to an error correction amount) between the zero point and the maximum value or the minimum value is smaller in the calibration functions 502, 503, and 504 according to the present embodiment, and the detection accuracy of the temperature of the wafer 109 or the wafer placing electrode 120 using the output of the temperature sensor 203 is improved.

As described above, according to the present embodiment, the temperature of the wafer 109 can be achieved with a high accuracy over the entire temperature range within which the processing of wafer 109 is assumed, and the processing yield can be improved.

Further, in the plasma processing apparatus according to the present embodiment, the value of the coefficient of the linear function indicating the correlation between the error of the output of the temperature sensor 203 and the set temperature of the refrigerant, which is detected by setting the temperature of the refrigerant to the plurality of values within the temperature ranges of the wafer 109 as the assumed processing condition by the temperature adjuster in advance, is used for correcting or calibrating the detection error of the wafer placing electrode 120 including the temperature sensor 203 and the wafer placing electrode 120 of another plasma processing apparatus having the same configuration as the temperature adjuster of the refrigerant supplied, which is connected to the wafer placing electrode 120. Also in this case, as illustrated in FIG. 5, the temperature range of the wafer 109 that is the assumed processing condition is divided into the plurality of continuous regions (three in FIG. 5), and correlation functions which are different linear functions having the detected coefficients and the error 0 (zero cross) points within the temperature regions may be used as an error calibration function for each temperature region.

REFERENCE SIGN LIST 100 plasma processing apparatus
101 vacuum container
102 shower plate
102a gas introduction hole
103 dielectric window
104 processing chamber
105 waveguide
106 electric field generating power source
107 magnetic field generating coil
108 electrode base member
109 wafer
110 vacuum exhaust port
111 conductor film
112 grounding portion
113 susceptor ring
116 plasma
120 wafer placing electrode
120a placement surface
120b upper surface
120d recessed portion
124 radio frequency power source
125 radio frequency filter
126 direct current power source
127 radio frequency power source
128, 129 matching device
130 variable load impedance box
201 electrostatic adsorption (ESC) electrode
202 heater electrode
203 temperature sensor
204 sensor hole
301 atmospheric side block
302 vacuum side block
303 vacuum processing unit
304 first vacuum transferring chamber
305 lock chamber
306 housing
307 cassette table
308 vacuum transferring robot
309 atmospheric transferring robot
310 second vacuum transferring chamber
311 vacuum transferring intermediate chamber
320 gate valve
401 inflow port
402 outflow port
403, 404 through hole

The invention claimed is:

1. A plasma processing apparatus, comprising:
a processing chamber which is arranged inside a vacuum container, and in which plasma is formed;
a sample table that is arranged in the processing chamber and has an upper surface on which a wafer to be processed is placed;
a metal base member that is arranged on the sample table and incudes, therein, a refrigerant flow path through which a temperature-adjusted refrigerant flows;
at least one temperature sensor that is arranged between the refrigerant flow path and an upper surface of the base member and is configured to detect a temperature; and
a controller that is configured to detect a temperature of the base member or the wafer being processed, which is placed on the sample table, by using an output from the temperature sensor, wherein
the controller is configured to detect the temperature of the base member or the wafer based on one of a plurality of relations indicating linear functions obtained from results of measurements taken in advance of the processing of the wafer between a plurality of errors and a corresponding plurality of set temperatures of the refrigerant each defining a difference between a temperature obtained from the output of the temperature sensor and an actual temperature of the base member or the wafer as an error, and
the linear functions are different corresponding to regions of a plurality of continuous temperature ranges within an adjustable temperature range of the refrigerant, and the plurality of linear functions include the same coefficient and have a point where the error is 0.

2. The plasma processing apparatus according to claim 1, further comprising:
a heater arranged between the upper surface of the sample table and the refrigerant flow path, wherein
an output of the heater is adjusted based on the detected temperature.

3. The plasma processing apparatus according to claim 1, wherein
a coefficient of the linear function is equal to a coefficient of a linear function indicating a relation between the error and the set temperature of the refrigerant within an entire adjustable temperature range of the refrigerant.

4. The plasma processing apparatus according to claim 1, wherein,
when an error between a temperature obtained from an output of a temperature sensor in a sample table of another plasma processing apparatus having substantially the same configuration as the plasma processing apparatus and the actual temperature of the base member or the wafer is defined as a substitution error, the coefficient of the linear function is equal to a coefficient of a linear function indicating a relation between the substitution error and the set temperature of the refrigerant.

5. A plasma processing method performed by a plasma processing apparatus, the plasma processing apparatus including a processing chamber which is arranged inside a vacuum container and in which plasma is formed, a sample table that is arranged in the processing chamber and has an upper surface on which a wafer to be processed is placed, a metal base member that is arranged on the sample table and includes, therein, a refrigerant flow path through which a temperature-adjusted refrigerant flows, and at least one temperature sensor that is arranged between the refrigerant flow path and an upper surface of the base member and is configured to detect a temperature, the plasma processing method comprising:
detecting a temperature of the base member or the wafer based on one of a plurality of relations indicating linear functions obtained from results of measurements taken in advance of the processing of the wafer between a plurality of errors and a corresponding plurality of set temperatures of the refrigerant each defining a difference between a temperature obtained from the output of the temperature sensor and an actual temperature of the base member or the wafer as an error, wherein
the linear functions are different corresponding to regions of a plurality of continuous temperature ranges within an adjustable temperature range of the refrigerant, and the plurality of linear functions include the same coefficient and have a point where the error is 0.

6. The plasma processing method according to claim 5, the plasma processing apparatus further including a heater arranged between the upper surface of the sample table and the refrigerant flow path, the method further comprising:
adjusting an output of the heater based on the detected temperature.

7. The plasma processing method according to claim 5, wherein
a coefficient of the linear function is equal to a coefficient of a linear function indicating a relation between the error and the set temperature of the refrigerant within an entire adjustable temperature range of the refrigerant.

8. The plasma processing method according to claim 5, wherein,
when an error between a temperature obtained from an output of a temperature sensor in a sample table of another plasma processing apparatus having substantially the same configuration as the plasma processing apparatus and the actual temperature of the base member or the wafer is defined as a substitution error, the coefficient of the linear function is equal to a coefficient of a linear function indicating a relation between the substitution error and the set temperature of the refrigerant.

* * * * *